(12) United States Patent
Yoon et al.

(10) Patent No.: US 12,068,766 B2
(45) Date of Patent: Aug. 20, 2024

(54) ANTENNA FILTER AND ELECTRONIC DEVICE COMPRISING SAME IN WIRELESS COMMUNICATION SYSTEM

(71) Applicant: SAMSUNG ELECTRONICS CO., LTD., Suwon-si (KR)

(72) Inventors: Seunghwan Yoon, Suwon-si (KR); Dongsik Shin, Suwon-si (KR); Dongjoo Kim, Suwon-si (KR); Danbi Jeon, Suwon-si (KR); Jongwook Zeong, Suwon-si (KR); Dabin Choi, Suwon-si (KR); Bonmin Koo, Suwon-si (KR); Jonghwa Kim, Suwon-si (KR); Jihye Kim, Suwon-si (KR); Haegweon Park, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/075,049

(22) Filed: Dec. 5, 2022

(65) Prior Publication Data

US 2023/0096000 A1   Mar. 30, 2023

Related U.S. Application Data

(63) Continuation of application No. PCT/KR2021/007046, filed on Jun. 4, 2021.

(30) Foreign Application Priority Data

Jun. 5, 2020   (KR) .................... 10-2020-0068679

(51) Int. Cl.
*H04B 1/04* (2006.01)
*H03H 9/02* (2006.01)
(Continued)

(52) U.S. Cl.
CPC ........... *H04B 1/04* (2013.01); *H03H 9/02086* (2013.01); *H03H 9/105* (2013.01); *H03H 9/542* (2013.01);
(Continued)

(58) Field of Classification Search
CPC ...... H04B 1/04; H04B 7/0404; H04B 7/0413; H03H 9/02086; H03H 9/105; H03H 9/542
See application file for complete search history.

(56) References Cited

U.S. PATENT DOCUMENTS 8,681,890 B2   3/2014   Petrovic
10,425,119 B2*   9/2019   Uejima .................. H04B 1/406
(Continued)

FOREIGN PATENT DOCUMENTS

JP   6-244836 A   9/1994
JP   2003-78462 A   3/2003
(Continued)

OTHER PUBLICATIONS

Communication dated Sep. 17, 2021, issued by the International Searching Authority in counterpart International Application No. PCT/KR2021/007046 (PCT/ISA/210).
(Continued)

*Primary Examiner* — Rahel Guarino
(74) *Attorney, Agent, or Firm* — Sughrue Mion, PLLC

(57) ABSTRACT

The present disclosure relates to an electronic device for radiating an output signal in a wireless communication system. In one embodiment, the electronic device includes: a power amplifier configure to receive an input signal; a splitter connected to the power amplifier, which a plurality of branches; a plurality of filters connected to the plurality of branches of the splitter; and a plurality of antenna elements connected to the plurality of filters. The plurality of
(Continued)

antenna elements radiates the output signal that is a portion of the input signal received by the power amplifier.

20 Claims, 13 Drawing Sheets

(51) Int. Cl.
*H03H 9/10* (2006.01)
*H03H 9/54* (2006.01)
*H04B 7/0404* (2017.01)
*H04B 7/0413* (2017.01)

(52) U.S. Cl.
CPC ......... *H04B 7/0404* (2013.01); *H04B 7/0413* (2013.01)

(56) References Cited

U.S. PATENT DOCUMENTS

| | | |
|---|---|---|
| 10,440,584 B1 | 10/2019 | Labadie et al. |
| 10,615,945 B1 | 4/2020 | Holzer |
| 10,637,160 B2 | 4/2020 | Zihir et al. |
| 2004/0209652 A1 | 10/2004 | Doi |
| 2012/0028690 A1* | 2/2012 | Liu ................ H01Q 1/246 455/571 |
| 2014/0016573 A1 | 1/2014 | Nuggehalli et al. |
| 2016/0111785 A1 | 4/2016 | Park |
| 2018/0145400 A1 | 5/2018 | Gabriel et al. |
| 2018/0192508 A1 | 7/2018 | Sun |
| 2018/0294868 A1 | 10/2018 | Ashworth |
| 2018/0316402 A1* | 11/2018 | Jaldén ................ H04B 7/0626 |
| 2019/0044547 A1* | 2/2019 | Nilsson ................ H04B 1/005 |
| 2019/0304934 A1 | 10/2019 | Kamphuis et al. |
| 2022/0173526 A1* | 6/2022 | Da Silveira ............. H01P 1/213 |

FOREIGN PATENT DOCUMENTS

| | | |
|---|---|---|
| JP | 2007-150566 A | 6/2007 |
| JP | 2012-75081 A | 4/2012 |
| KR | 10-2010-0039578 A | 4/2010 |
| KR | 10-2014-0009046 A | 1/2014 |
| KR | 10-1595551 B1 | 2/2016 |
| WO | 2016/019843 A1 | 2/2016 |

OTHER PUBLICATIONS

Communication dated Sep. 17, 2021, issued by the International Searching Authority in counterpart International Application No. PCT/KR2021/007046 (PCT/ISA/237).

Extended European Search Report dated Oct. 25, 2023, issued by European Patent Office in European Patent Application No. 21818617.9.

Office Action dated Jan. 11, 2024, issued by Korean Patent Office in Korean Patent Application No. 10-2020-0068679.

* cited by examiner

ANTENNA FILTER AND ELECTRONIC DEVICE COMPRISING SAME IN WIRELESS COMMUNICATION SYSTEM

CROSS-REFERENCE TO RELATED APPLICATIONS

This application is a by-pass continuation application of International Application No. PCT/KR2021/007046, filed on Jun. 4, 2021, which based on and claims priority to Korean Patent Application No. 10-2020-0068679, filed on Jun. 5, 2020, in the Korean Intellectual Property Office, the disclosures of which are incorporated by reference herein in their entireties.

BACKGROUND

1. Field

The present disclosure generally relates to a wireless communication system, and more particularly, relates to an antenna filter in a wireless communication system and an electronic device including the antenna filter.

2. Description of Related Art

To meet the increasing demand for wireless data traffic after commercialization of $4^{th}$ generation (4G) communication systems, efforts have been made to develop improved $5^{th}$ generation (5G) communication systems or pre-5G communication systems. For this reason, the 5G communication systems or the pre-5G communication systems are called beyond 4G network communication systems or post Long Term Evolution (LTE) systems.

In order to achieve a high data rate, the 5G communication system has been considered for implementation in an ultra-high frequency (millimeter wave (mmWave)) band (e.g., such as a 60 gigabyte (GHz) band). In the 5G communication system, beamforming, massive Multiple-Input Multiple-Output (MIMO), Full Dimensional MIMO (FD-MIMO), array antenna, analog beam-forming, and large scale antenna technologies have been discussed in order to alleviate a path loss of radio waves and increase a propagation distance of radio waves in the ultra-high frequency band.

In addition, in the 5G communication system, technologies such as an evolved small cell, an advanced small cell, a cloud Radio Access Network (RAN), an ultra-dense network, Device-to-Device communication (D2D), wireless backhaul, moving network, cooperative communication, Coordinated Multi-Points (CoMP), and reception interference cancellation have been developed for the purpose of improvement of a system network.

In addition, in the 5G system, hybrid Frequency shift keying and Quadrature Amplitude Modulation (FQAM) and Sliding Window Superposition Coding (SWSC), which are Advanced Coding Modulation (ACM) methods, and Filter Bank Multi Carrier (FBMC), Non-Orthogonal Multiple Access (NOMA), and Sparse Code Multiple Access (SCMA), etc., which are advanced access technologies, have been developed.

In order to improve communication performance, products equipped with multiple antennas have been developed, and it is expected that equipment with a much larger number of antennas will be used using the massive MIMO technology. As the number of antenna elements in a communication device increases, the number of Radio Frequency (RF) components (e.g., filters, etc.) inevitably increases accordingly. Based on the above discussion, the present disclosure presents a device and a method for minimizing a filter in a wireless communication system.

The present disclosure presents a device and a method for achieving the same performance as a high power filter, through a low power filter in a wireless communication system. Also, the present disclosure presents a device and a method for replacing a metal cavity filter, through a small elastic filter or a ceramic filter in a wireless communication system. Further, the present disclosure presents a device and a method for arranging a filter in a path between a splitter and an antenna in a wireless communication system.

SUMMARY

According to an aspect of the disclosure, an electronic device for radiating an output signal in a wireless communication system, includes: a power amplifier configured to receive an input signal; a splitter connected to the power amplifier, which a plurality of branches; a plurality of filters, the plurality of filters connected to the plurality of branches of the splitter; and a plurality of antenna elements connected to the plurality of filters. The plurality of antenna elements radiates the output signal that is a portion of the input signal received by the power amplifier.

According to another aspect of the disclosure, a Multiple input Multiple output Unit (MMU) device includes: at least one processor transmitting an input signal; a plurality of power amplifiers configured to receive the input signal from the at least one processor; a splitter connected to the plurality of power amplifier; a plurality of filters connected to the splitter; and an antenna array comprising a plurality of sub-arrays, the plurality of sub-arrays includes a first sub-array, the first sub-array comprising a plurality of antenna elements, the plurality of antenna elements connected to the plurality of filters. Each of the plurality of the filters performs filtering a specific frequency band of the input signal.

A device and a method of one or more embodiments of the present disclosure may efficiently design antenna equipment including a plurality of radio frequency (RF) paths, by reducing a size and increasing a mass productivity while meeting a rated capacity, through a small low power filter structure for replacing a high power filter.

Effects obtainable in the present disclosure are not limited to the above-mentioned effects, and other effects not mentioned may be clearly understood by those of ordinary skill in the art to which the present disclosure belongs from a description below.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

Figure 1:
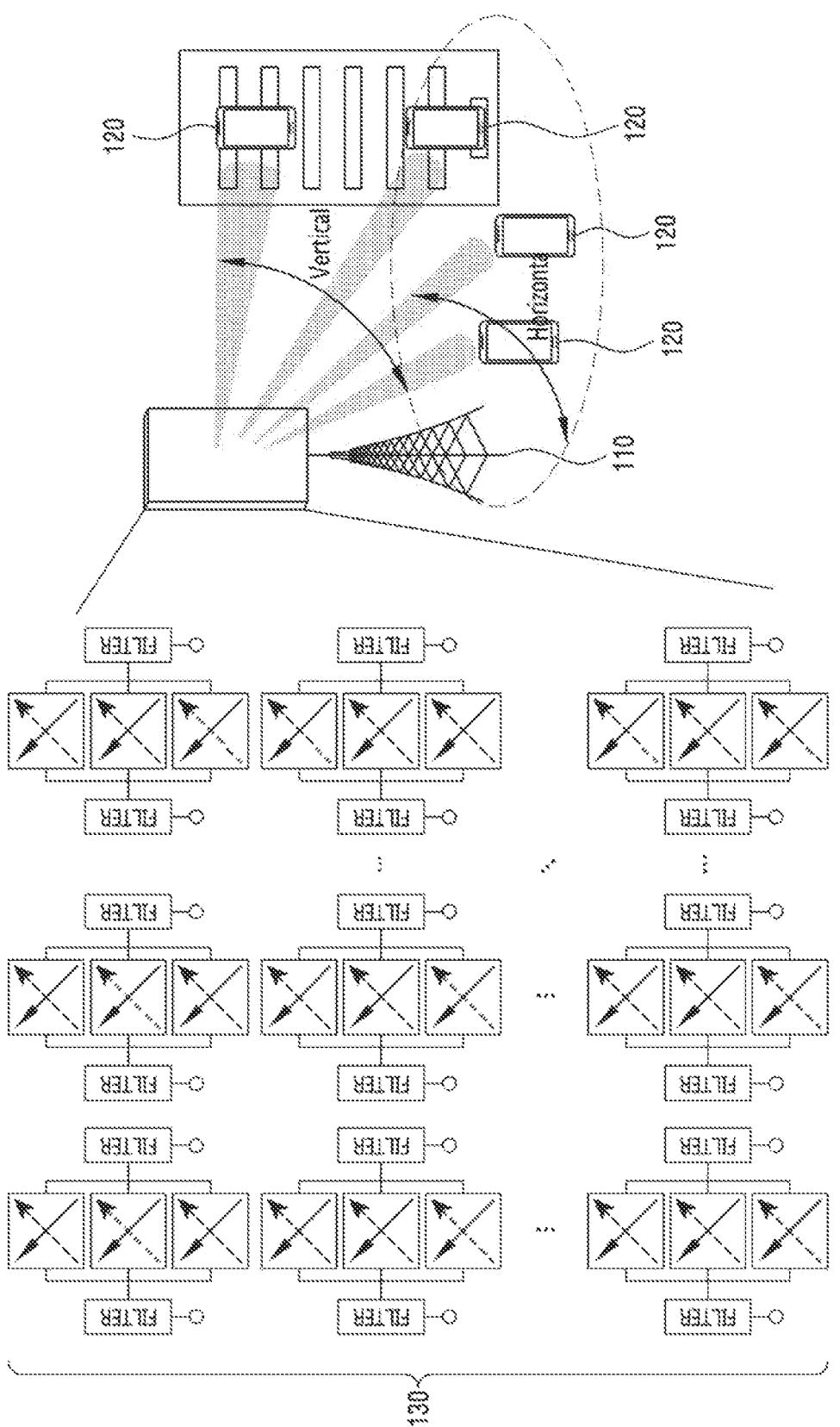
FIG. 1 illustrates a wireless communication system according to one or more embodiments of the present disclosure.

Terms used in the present disclosure are used only to describe specific embodiments, and may not be intended to limit the scope of other embodiments. The singular expression may include the plural expression unless the context clearly dictates otherwise. Terms used herein, including technical or scientific terms, may have the same meanings as commonly understood by a person having ordinary skill in the art described in the present disclosure. Among the terms used in the present disclosure, terms defined in a general dictionary may be interpreted as the same or similar meaning as the meaning in the context of a related art, and unless explicitly defined in the present disclosure, are not interpreted as ideal or excessively formal meanings. In some cases, even terms defined in the present disclosure may not be construed to exclude embodiments of the present disclosure.

In one or more embodiments of the present disclosure described below, a hardware access method will be described as an example. However, since the one or more embodiments of the present disclosure include a technology using both hardware and software, the one or more embodiments of the present disclosure do not exclude a software-based approach method.

Terms referring to components of electronic devices used in the following description (e.g., a filter, an amplifier, a Printed Circuit Board (PCB), a flexible PCB (FPCB), an antenna element, a compensation circuit, a processor, a chip, a component, and a device), terms referring to the shape of the components (e.g., a structure, an opening part, a connection part, a contact part, a guide part, a protrusion part, a fixed body, and an elastic body), and terms referring to circuits (e.g., a splitter, a divider, a coupler, a combiner, an RF path, a signal line, a data line, an RF signal line, an antenna line, an RF module, and an RF circuit) are exemplified for convenience of description. Accordingly, the present disclosure is not limited to the terms described below, and other terms having equivalent technical meanings may be used. Also, terms such as ' . . . part', ' . . . unit', ' . . . thing', and ' . . . body' used hereinafter may refer to at least one shape structure or refer to a unit for processing a function.

Also, the present disclosure describes one or more embodiments by using terms used in some communication standards (e.g., 3rd Generation Partnership Project (3GPP) and Institute of Electrical and Electronics Engineers (IEEE)), but this is only an example for description. The one or more embodiments of the present disclosure may be easily modified and applied even in other communication systems.

Hereinafter, the present disclosure relates to an antenna filter in a wireless communication system and an electronic device including the same. Specifically, the present disclosure describes techniques for achieving the miniaturization of a product and close performance through a plurality of low power filters (a filter having a relatively low rated capacity), instead of an existing high power filter (a filter having a relatively high rated capacity), in the wireless communication system.

A high power filter and a low power filter mentioned in the present disclosure may be determined depending on whether a medium is used inside a resonator. The high power filter may operate only when a field intensity per unit volume is not concentrated. When the medium is used inside the resonator, the size of the resonator becomes smaller and the intensity per unit volume becomes stronger due to a dielectric substance, making it unsuitable for the high power filter. A resonator including only air without using a medium is larger in size than a resonator filled with a medium. Also, since this resonator does not have a medium, the field intensity per unit volume is small, so it is suitable for the high power filter. Accordingly, the high power filter and the low power filter may be distinguished according to whether or not the medium is used inside the resonator. According to an embodiment, the low power filter may include an elastic filter or a ceramic filter. For example, the elastic filter may include a SAW filter. Also, for example, the elastic filter may include a BAW filter.

FIG. 1 illustrates a wireless communication system according to one or more embodiments of the present disclosure. The wireless communication environment 100 of FIG. 1 exemplifies a base station 110 and a terminal 120, as parts of nodes that use a wireless channel.

The base station 110 is a network infrastructure that presents a wireless connection to the terminal 120. The base station 110 has a coverage defined as a certain geographic area, based on a distance capable of transmitting a signal. In addition to the base station, the base station 110 may be referred to as an 'access point (AP)', an 'eNodeB (eNB)', a '5th generation node (5G node)', a '5G NodeB (NB)', a 'wireless point', a 'transmission/reception point (TRP)', an 'access unit', a 'distributed unit (DU)', a 'radio unit (RU)', a 'remote radio head (RRH),' or other terms having an equivalent technical meaning. The base station 110 may transmit a downlink signal or receive an uplink signal.

The terminal 120, a device used by a user, performs communication with the base station 110 through a wireless channel. In some cases, the terminal 120 may be operated without user's involvement. That is, the terminal 120, when it is a device performing machine type communication (MTC), may not be carried by a user. The terminal 120 may be referred to as 'user equipment (UE)', a 'mobile station', a 'subscriber station', 'customer premises equipment (CPE) ', a 'remote terminal', a 'wireless terminal', an 'electronic device', a 'vehicle terminal', a 'user device' or other terms having an equivalent technical meaning.

As one of techniques for alleviating a propagation path loss and increasing a propagation distance of radio waves, a beamforming is used. The beamforming generally uses a plurality of antennas to concentrate a reaching area of radio waves or to increase the directivity of a reception sensitivity for a specific direction. Accordingly, the base station 110 may include the plurality of antennas in order to form beamforming coverage instead of forming a signal in an isotropic pattern by using a single antenna. According to an embodiment, the base station 110 may include a massive MIMO unit (MMU). A form in which the plurality of antennas is aggregated may be referred to as an 'antenna array', and each antenna included in the antenna array may be referred to as an 'array element' or an 'antenna element'. The antenna array may be configured in various forms such as a linear array, a planar array, etc. The antenna array may be referred to as a massive antenna array.

A major technology for improving a data capacity of 5G communication is the beamforming using an antenna array connected to multiple RF paths. For a higher data capacity, a number of RF paths may be increased or power per RF path may be increased. Increasing the RF path more increases the size of a product, and is currently at a level not capable of increasing any more due to space constraints in actually installing base station equipment. In order to increase an antenna gain through high output without increasing the number of RF paths, a plurality of antenna elements may be connected to the RF path by using a splitter (or a divider), thereby increasing the antenna gain. Here, the antenna elements corresponding to the RF paths may be referred to as a sub-array.

In order to improve communication performance, the number of antennas (or antenna elements) of the equipment (e.g., the base station 110) performing wireless communication is increasing. In addition, since the number of RF parts (e.g., amplifiers and filters) and components for processing an RF signal received or transmitted through the antenna element is increased, a spatial gain and cost efficiency are essentially required while meeting communication performance in configuring communication equipment.

In FIG. 1, the base station 110 of FIG. 1 is described as an example in order to describe an antenna filter of the present disclosure and an electronic device including the same, but one or more embodiments of the present disclosure are not limited thereto. As the antenna filter according to one or more embodiments of the present disclosure and the electronic device including the same, radio equipment performing an equivalent function to the base station besides the base station 110, radio equipment (e.g., TRP) connected to the base station, the terminal 120 of FIG. 1, or any other communication equipment used for 5G communication are all possible undoubtedly.

Hereinafter, in the present disclosure, an antenna array including sub-arrays is described as an example of a structure of a plurality of antennas for communication in a Multiple Input Multiple Output (MIMO) environment, but in some embodiments, easy change for beamforming is possible undoubtedly.

As described above, as the number of paths increases, the number of filters for processing a signal in each antenna element also increases. The filter may include a circuit of performing filtering to transmit a signal of a desired frequency by forming a resonance. That is, the filter may perform a function for selectively identifying a frequency. Meanwhile, in order to arrange a plurality of filters in a limited space, the miniaturization and weight reduction of the filters are required. Hereinafter, a method for implementing this by using a low power filter according to one or more embodiments of the present disclosure will be described with reference to FIG. 2 and FIG. 3.

Figure 2:
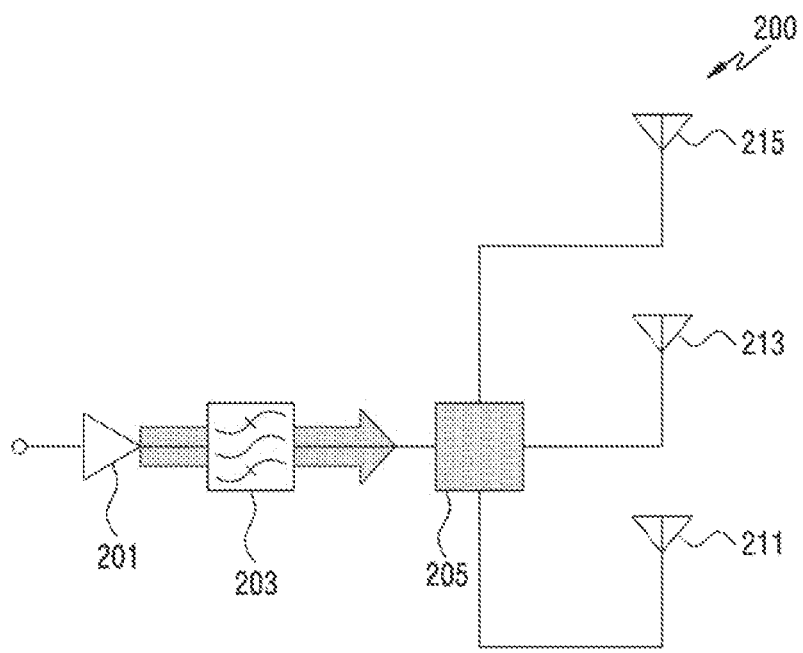
FIG. 2 illustrates an example of a higher power filter in relevant art.

FIG. 2 illustrates an example of a high power filter in the relevant art. The high power filter may be replaced by a low power filter according to one or more embodiments of the present disclosure. Hereinafter, in FIG. 2, a sub-array of an array antenna has been described as an example including three antenna elements, but this is only an example for describing embodiments of the present disclosure, and is not construed as limiting the scope of the present disclosure.

Referring to FIG. 2, the electronic device 200 may include a power amplifier 201, a high power filter 203, a splitter 205, a first antenna element 211, a second antenna element 213, and a third antenna element 215.

The power amplifier 201 may present a high output by amplifying the power of an input signal. For example, the power amplifier 201 may present an output signal of maximum M watts. At this time, the filter should be able to control the power of M watts. The high power filter 203 may have a rated capacity possible to allow M watts. A signal passing through the power amplifier 201 and the high power filter 203 may be transmitted to each antenna element via the splitter 205. The first antenna element 211, the second antenna element 213, or the third antenna element 215 may be connected to one RF path via the splitter 205. The first antenna element 211, the second antenna element 213, and the third antenna element 215 may be connected to the high power filter 203 through the RF path.

To increase a total data capacity without increasing the number of RF paths, an antenna gain of the sub-array may be increased through a high output. When power per RF path increases, rated capacities of the amplifier and the filter, which are main elements of the RF path, may also increase. In recent years, power higher than 3 watts (W) is required. When the rated capacity power increases, it is necessary to use a metal resonator filter of a large size and heavy weight among various filters. The high power filter 203 may be used to accommodate high power. This means that relatively small and light dielectric filters, Surface Acoustic Wave (SAW) filters, and Bulk Acoustic Wave (BAW) filters may not be used.

The high power filter 203 may include a metal resonator filter. The metal resonator filter is made of metal and includes several resonators. The metal resonator filter requires a separate material (e.g., a metal) for fixing, and each resonator is very sensitive and has a disadvantage that it may be individually tuned by hands through a screw. This tuning is a factor of lowering mass productivity, causing a high defect rate, and increasing a price of the filter. Therefore, although the high power filter is stable in terms of performance, it is not suitable for mass production as antenna elements and RF paths are increased. Due to this, many technologies for filters capable of replacing the metal resonator filters are being studied.

Figure 3:
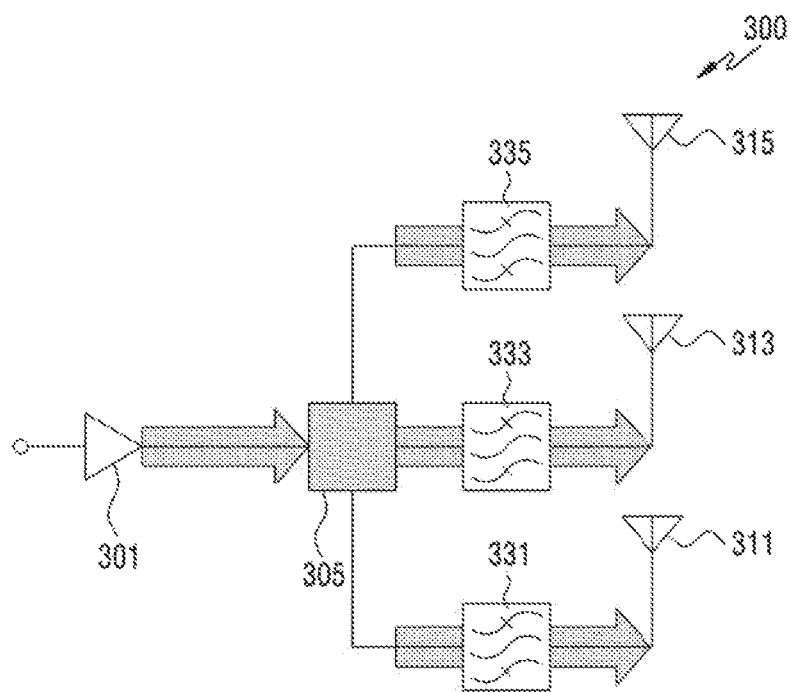
FIG. 3 illustrates an example of a low power filter according to one or more embodiments of the present disclosure.

FIG. 3 illustrates an example of a low power filter according to one or more embodiments of the present disclosure. As described above, since the number of required filters also increases due to an increased number of RF paths, the miniaturization of the filter is required. Therefore, in order to replace the high power filter, a need for a (relatively) small-sized low power filter (also referred to as a small-sized filter), which can be produced in mass, is increasing. However, when the high power filter is simply replaced with the low power filter, supplied power exceeds an allowable capacity of the low power filter, which may cause a problem. Accordingly, in order to withstand a rated capacity (or referred to as a power control capacity) of the high power filter, a filter presenting a lower rated capacity than the high power filter 203 (e.g., metal cavity filter) of FIG. 2 is proposed in the present disclosure. Hereinafter, in FIG. 3, a sub-array of an array antenna is described as an example including three antenna elements, but this is only an example for describing embodiments of the present disclosure, and is not construed as limiting the scope of the present disclosure.

Referring to FIG. 3, in one embodiment, an electronic device 300 may include a power amplifier 301, a splitter 305, a first antenna element 311, a second antenna element 313, a third antenna element 315, a first low power filter 331, a second low power filter 333, and a third low power filter 335.

The power amplifier 301 may present a high output by amplifying the power of an input signal. For example, the power amplifier 301 may present an output signal of maximum M watts. At this time, the filter should be able to control the power of M watts.

The splitter 305 may be used to connect each of the antenna element of the sub-array with an RF path in order to secure antenna performance. The splitter 305 is an N-way splitter (which may be referred to as an 'N-way divider') that branches (or merges) the antenna elements of the sub-array, and in FIG. 3, a 3-way splitter is exemplified. Regardless of the arrangement of the filter, the electronic device 300 may include the splitter 305. The splitter 305 may include various circuits. For example, the splitter 305 may be implemented as a T-junction power divider. Also, for example, the splitter 305 may be implemented as a Wilkinson power divider. The splitter 305 may be referred to as a 'coupler.' A signal passing through the power amplifier 301 may be transmitted to each antenna element via the splitter 305.

The first low power filter 331 may be arranged between the splitter 305 and the first antenna element 311. The second low power filter 333 may be arranged between the splitter 305 and the second antenna element 313. The third low power filter 335 may be arranged between the splitter 305 and the third antenna element 315. In order to process the output of M watts, each filter may be required to process the output of M/N watts. Here, the N may mean the number of filters connected to the splitter (or the number of antenna elements connected to the splitter, the number of antenna elements of the sub-array). In the example of FIG. 3, each of the first low power filter 331, the second low power filter 333, and the third low power filter 335 may have a rated capacity to withstand the output of M/3 watts.

As such, in order to withstand the high output of the power amplifier by using the filter having the low rated capacity, the structure according to one or more embodiments of the present disclosure may include the low power filter arranged between the splitter and each antenna element of the sub-array. Hereinafter, this structure may be referred to as a branch arrangement structure for the low power filter. The splitter 305 may be connected to the power amplifier 301 without another filter (e.g., the high power filter 203 of FIG. 2). Instead of the filter arranged after the power amplifier 301, the filters are arranged on respective antenna paths after the splitter 305, whereby the electronic device 300 may process a high output of the power amplifier 301 by using the low power filters. According to an embodiment, the low power filters (the first low power filter 331, the second low power filter 333, and the third low power filter 335), which may be Surface Mount Device (SMD) type filters, may be implemented in a small size and replace the high power filter 203 (e.g., a metal cavity filter) illustrated in FIG. 2.

As described with reference to FIG. 3, the embodiments of the present disclosure may include the structure in which the filter is attached to each branch of the splitter, rather than using one filter in one RF path. According to an embodiment, power branched to each path may be the same. Even power delivered to each filter may be reduced in magnitude by 1/N as much as the number (N) of paths branched by the splitter. According to another embodiment, power branched by the splitter may not be the same. Power delivered to each filter may be reduced as much as a power distribution ratio for each path. As described above, since each filter is arranged on the path branched from the splitter, power transmitted through each path branched by the splitter is lowered. By using this characteristic, it may be possible to meet a high rated capacity by attaching N filters lower than a rated capacity to N paths respectively after the splitter is branched, instead of using a filter of a high rated capacity in the RF path.

According to one or more embodiments, in the present disclosure, a low power filter having a low rated capacity may be configured in various types. According to an embodiment, the low power filter may include a ceramic filter. Also, according to an embodiment, the low power filter may include a SAW filter. Also, according to an embodiment, the low power filter may include a BAW filter. In addition to the above-described examples, as the low power filter for the arrangement structure of the present disclosure, a filter having a maximum output less than a specified reference value may be used. Other than the high power filter in the present disclosure, the SAW filter, the BAW filter, the ceramic filter, as well as any type of filter using a medium inside a resonator may be used as the low power filter of the present disclosure. For example, when any medium is used inside the resonator in the low power filter that may be arranged at a rear end of the splitter, it may be understood as an embodiment of the present disclosure. In other words, a specific low power filter arranged on a splitter branch may be used according to one or more embodiments of the present disclosure.

By arranging a filter on a path branched through a splitter, 5G equipment may be implemented by means of relatively small low power filters, without a high power filter requiring tuning. A basic function of the filter is to filter out a necessary frequency band by using a piezoelectric body that resonates at a specific frequency. According to an embodiment, the low power filter may be a BAW filter. Because a SAW filter forms an electrode on a piezoelectric surface, there is a limit to miniaturization. Also, its performance is limited at a high frequency of 2 GHz or more. On the other hand, the BAW filter forms electrodes on the top and bottom of the piezoelectric body, and filters a signal vertically. Accordingly, the BAW filter exhibits excellent performance in miniaturization and high frequency response, etc. According to an embodiment, the BAW filter may be implemented using a micro electro mechanical systems (MEMS) device.

The BAW filter has an advantage of miniaturization and integration possibility. In a wireless mobile communication system, as it is required to support a high frequency due to the trend of miniaturization and multi-functionality of base stations, terminals, etc., a necessity thereof is increasing. Although the BAW filter has a disadvantage that an allowable output is low, an output required for the BAW filter may be lowered through the arrangement structure (arranged on the branched path through the splitter) of the present disclosure. Accordingly, through the structure arranged between the splitter and the antenna element, an antenna array device may be implemented to include the BAW filter. By using the BAW filter, the antenna array device, is effective in miniaturization and cost, may be implemented. In addition, the performance of the antenna array may be maximized by minimizing a defect rate/error between parts through mass production.

According to another embodiment, the low power filter may be a SAW filter. In a specific frequency band (e.g., 1.9 GHz), the SAW filter may be used as the low power filter arranged after the splitter. In this case, the SAW filter is used for a specific sub-array, and the BAW filter is used for another specific sub-array, and in addition, the SAW filter is used as the low power filter in all arrays, so they may also be understood as an embodiment of the present disclosure.

To check whether the arrangement structure proposed in FIG. 3 is implemented, various methods may be used. According to an embodiment, when a specified rated capacity of each of the plurality of filters is lower than power outputted from the power amplifier or inputted to the splitter, whether the arrangement structure of the low power filter located at a rear end of the splitter is implemented may be checked. Also, according to an embodiment, since the specified rated capacity of each of the plurality of filters is designed to withstand the magnitude of the power inputted to the splitter distributed through each branch, whether the arrangement structure of the low power filter located at the rear end of the splitter is implemented may be checked through being greater than or being equal to input power divided by the number of branches of the splitter.

Figure 4A:
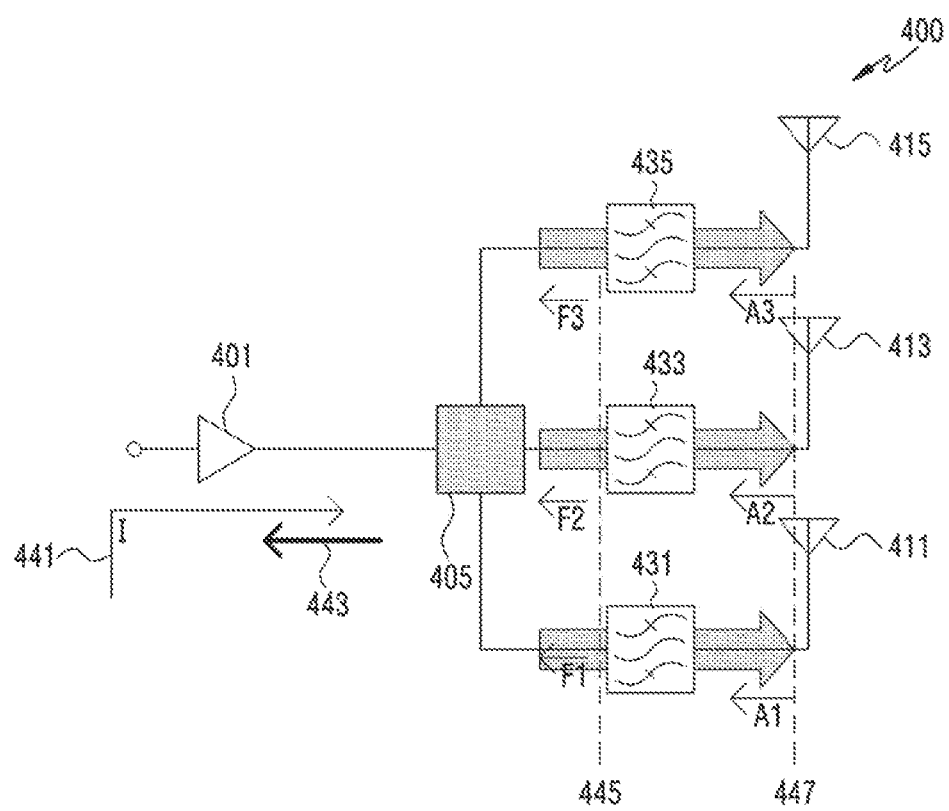
FIGS. 4A and 4B illustrate a design principle of a low power filter according to one or more embodiments of the present disclosure.
Figure 4B:
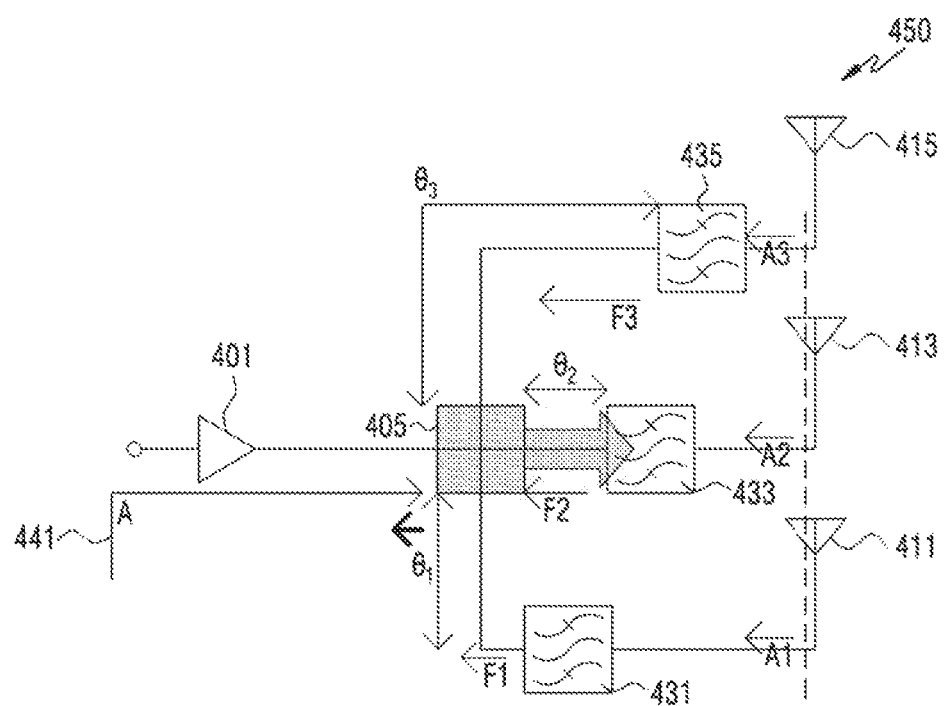

FIGS. 4A and 4B illustrate a design principle of the low power filter according to one or more embodiments of the present disclosure. Hereinafter, in FIG. 4A and FIG. 4B, the sub-array of an array antenna is described as an example including three antenna elements, but this is only an example for explaining the embodiments of the present disclosure, and is not construed as limiting the scope of the present disclosure.

Referring to FIG. 4A and FIG. 4B, the electronic device 400 may include a power amplifier 401, a splitter 405, a first antenna element 411, a second antenna element 413, a third antenna element 415, a first low power filter 431, a second low power filter 433, and a third low power filter 435. The power amplifier 401 and the splitter 405 correspond to the power amplifier 301 and the splitter 305 of FIG. 3, respectively, and the description of FIG. 3 may be applied to the power amplifier 401 and the splitter 405, respectively, in the same manner or in a manner obvious to those skilled in the art.

The first low power filter 431 may be arranged or provided between the splitter 405 and the first antenna element 411. The second low power filter 433 may be arranged between the splitter 405 and the second antenna element 413. The third low power filter 435 may be arranged between the splitter 405 and the third antenna element 415. In order to process the output of M watts, each filter may be required to process the output of M/N watts. Here, the N may mean the number of filters connected to the splitter (or the number of antenna elements connected to the splitter, the number of antenna elements of the sub-array). In FIG. 4, each of the first low power filter 431, the second low power filter 433, and the third low power filter 435 may have a rated capacity to withstand the output of M/3 watts.

The splitter 405 is an N-way splitter that branches (or merges) the antenna elements of the sub-array, and in FIG. 3, a 3-way splitter is exemplified. According to an embodiment, N low power filters having the same electrical characteristics (e.g., rated capacity) may be arranged in each branch of the splitter 405. In this case, the N low power filters (e.g., BAW filters) having a power control capacity of M/N watts may replace a high power filter (e.g., a metal cavity filter) having a power control capacity of M watts. As described above with respect to FIG. 3, because each of the low power filters are arranged between each branch of the splitter 405 and the antenna elements at a rear end of the splitter 405, even if the output of the amplifier is a high output, the low power filter is possible to receive a signal, because corresponding power is distributed.

When the low power filter is arranged in each branch by the splitter, a reflected signal may be provided due to the arrangement of the filter. When the filter is attached, there is a risk that performance may be deteriorated due to a return loss at an input end of an RF path. In a structure in relevant art, because only the antenna is attached after branching by the splitter, the return loss was determined only by a signal reflected from the antenna. However, when the arrangement structure of one or more embodiments of the present disclosure is applied, a reflected signal of a filter attached to each of N branches and a signal reflected from an antenna are combined, which may increase performance deterioration caused by the return loss. Accordingly, one or more embodiments of the present disclosure propose to remove a signal reflected from each of N filters in a branch arrangement structure for a low power filter.

When an incident wave 441 is applied through the power amplifier 401, a reflected wave 443 is provided. In this case, a reflection coefficient may be defined by the following equation:

$$\text{Reflection Coefficient} = \frac{R}{1} \quad \text{[Equation 1]}$$

Here, the 'Reflection Coefficient' denotes a reflection coefficient, the 'I' denotes the incident wave 441, and the 'R' denotes the reflected wave 443.

The reflected wave 443 may include a sum of a filter reflected wave 445 by the input of a filter stage and an antenna reflected wave 447 by the input of an antenna stage. For example, the reflected wave 443 may be expressed as the following equation.

$$R = F_{total} + A_{total} = \left(\sum_{i=1}^{N} F_i\right) + \left(\sum_{i=1}^{N} A_i\right) \quad \text{[Equation 2]}$$

Here, the '$F_{total}$' denotes a total filter reflected wave 445 and the '$A_{total}$' denotes a total antenna reflected wave 447. The '$F_i$' denotes a reflected wave by the input of a filter arranged in a branch i, and the '$A_i$' denotes a reflected wave by the input of an antenna of the branch i, and the 'N' denotes the number of branches. In this case, when the splitter includes three branches (i.e., N=3) in the example shown in FIG. 4A or FIG. 4B, Equation 2 may be expressed as follows.

$$R = F_{total} + A_{total} = (F_1 + F_2 + F_3) + (A_1 + A_2 + A_3) \quad \text{[Equation 3]}$$

In general, after branching from the splitter, when the filters are identically arranged as shown in FIG. 4A, reflected signals are all combined as described above. However, when phases of N reflected signals are artificially adjusted, the N reflected signals may be cancelled out. Accordingly, according to an embodiment, a low power filter arrangement structure may include a filter arrangement for canceling the reflected signal.

After branching from the splitter, there is an electrical phase difference between the respective filters. The low power filters may be arranged wherein a magnitude of a sum of respective N reflected signals becomes zero (0) when N signals branched from the splitter are reflected from the low power filter and are again incident on the splitter. For example, if the electrical phase difference ($\theta_d$) between the respective filters is 360° (degree)/(2*N), when N signals branched from the splitter are reflected from the low power filter and are incident again on the splitter, a magnitude of the sum of the respective N reflected signals may be zero (0).

The reflected wave component by the filter in Equation 2 is expressed in consideration of the phase difference as follows.

$$F_{total} = \left(\sum_{i=1}^{N} F \angle 2\theta_i\right) = 0 \quad \text{[Equation 4]}$$

Here, the '$F_{total}$' is a total filter reflected wave, the 'F' is a magnitude of a filter reflected wave, and the '$\theta_i$' is a phase shift of a filter of a branch i. Because a reflected wave is reflected from a filter input stage and is returned to the splitter, each reflected wave has a phase change of a difference of total $2\theta_i$. At this time, as an example, when the phase difference dependent on the arrangement (e.g., a transmission line) of the filters in each branch is $\theta_d$, a condition (hereinafter, a phase difference condition) for meeting Equation 4 may be the following Equation.

$$\theta_d = \frac{360}{2N} \quad \text{[Equation 5]}$$

Here, the '$\theta_d$' is a phase difference dependent on the arrangement (e.g., a transmission line) of filters between the branches, and the 'N' denotes the number of the branches. For example, when there are three branches from the splitter, an electrical phase difference condition ($\theta_d$) between the filters for canceling the reflected signal becomes 60°.

As illustrated in FIG. 4B, after splitter branching, when the arrangement of the filters for each path is made wherein a phase difference becomes $\theta_d$, $2\theta_d$, and $3\theta_d$, phases of signals branched from the splitter and reflected from the respective filters become $2\theta_d$, $4\theta_d$, and $6\theta_d$. As a result, the three signals reflected from the filter have the same magnitude and have phases of 120°, 240°, and 360°, respectively. In this case, the magnitude of the summed signals is zero (0), and is canceled. When an electrical phase difference between the filters is adjusted as above, it is possible to cancel the reflected signals from the plurality of filters lower than a rated capacity and to solve performance deterioration caused by a return loss, which has been a problem.

In consideration of the Equations of the above-described embodiments, in some embodiments, whether the filter arrangement considering the above-described phase difference is implemented may be checked by identifying that a sum of reflected waves caused by filter insertion is zero (0). Also, in some embodiments, even if the filter reflected waves are not all canceled due to design constraints, when the reflected waves are partially canceled due to a phase difference on each branch, whether the filter arrangement considering the phase difference of the present disclosure is implemented may be checked.

Figure 5A:
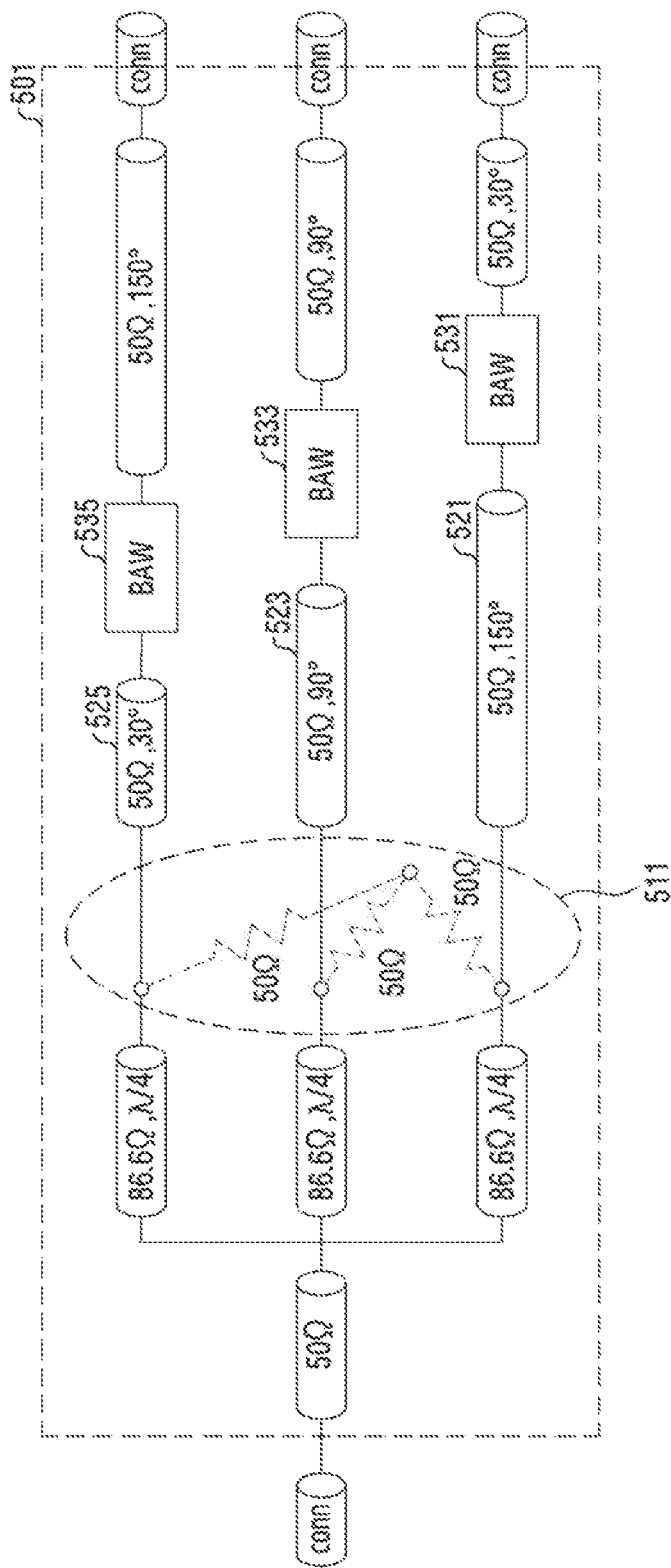
FIGS. 5A and 5B illustrate an example of a design of a low power filter according to one or more embodiments of the present disclosure.
Figure 5B:
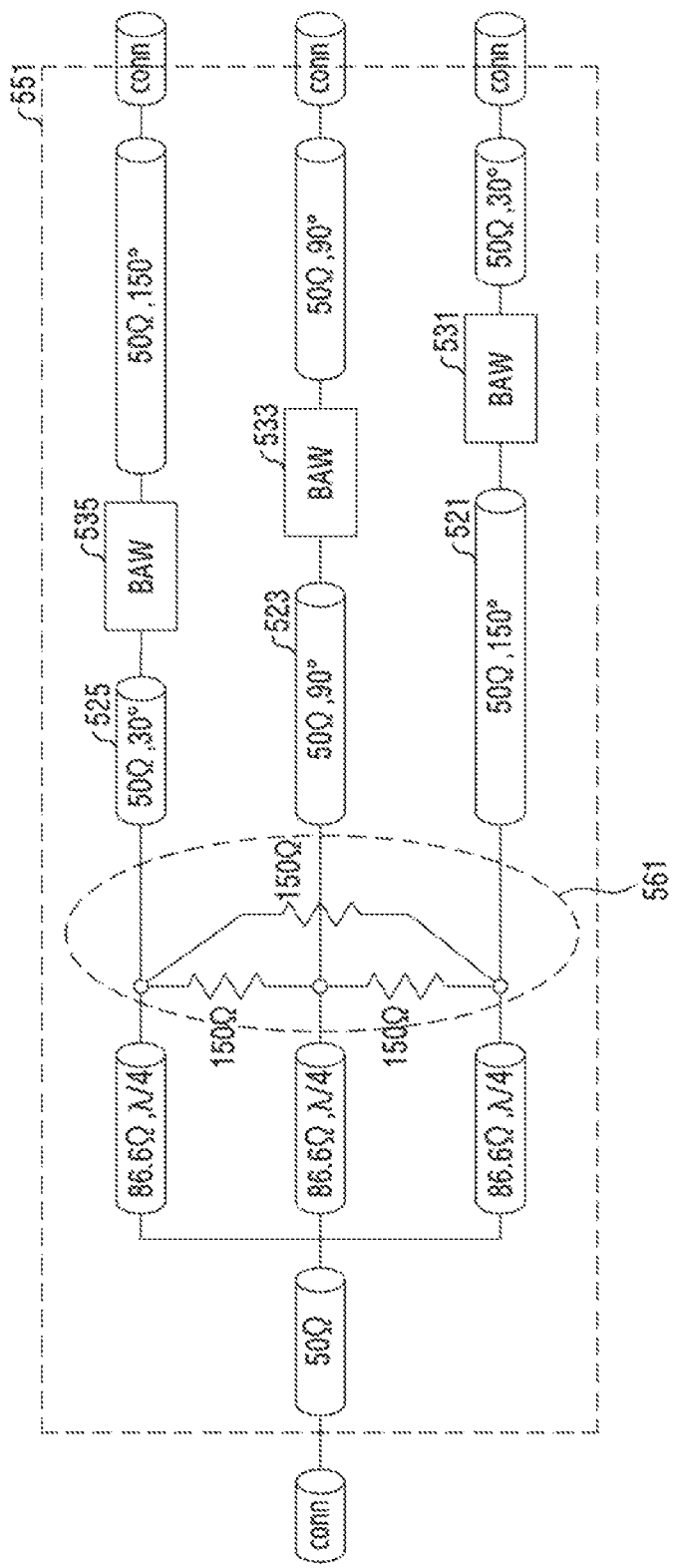

FIGS. 5A and 5B illustrate an example of a design of the low power filter according to one or more embodiments of the present disclosure. Circuits shown in FIG. 5A and FIG. 5B are only examples of the low power filter arrangement described through FIG. 3 and FIG. 4B, and are not to be construed as limiting the embodiments of the present disclosure.

Referring to FIG. 5A, an arrangement structure 501 of the low power filters may include a Y-type load 511. A load on each branch may include a characteristic impedance of 50 Ohms. After the Y-type load 511, a first branch may include a first transmission line 521 and first filter 531 for impedance matching. After the Y-type load 511, a second branch may include a second transmission line 523 and second filter 533 for impedance matching. After the Y-type load 511, a third branch may include a third transmission line 525 and third filter 535 for impedance matching.

To minimize a reflected wave effect caused by the filter, the arrangement of each transmission line and filter may be designed wherein a phase shift sum becomes 0. According to an embodiment, in the case of a 3-way splitter, as mentioned through Equation 1 to Equation 5, the filters may be arranged wherein a phase difference of each branch becomes 60 degrees. At each branch, a length of a different transmission line presents a different phase shift. For example, the first transmission line 521 may have a phase of 150°. A reflected wave by the first filter 531 may present a phase shift (i.e.)—60° of 300°. The second transmission line 523 may have a phase of 90°. A reflected wave by the second filter 533 may present a phase shift of 180°. The third transmission line 525 may have a phase of 30°. A reflected wave by the third filter 535 may present a phase shift (i.e.)—60° of 60°. Through this, a total reflected wave by the first filter 531, the second filter 533, and the third filter 535 may be zero (0).

Referring to FIG. 5B, an arrangement structure 551 of the low power filters may include a Δ-type load 561. A load on each branch may include a characteristic impedance of 150 Ohms. After the Δ-type load 561, a first branch may include a first transmission line 521 and a first filter 531 for impedance matching. After the Δ-type load 561, a second branch may include a second transmission line 523 and a second filter 533 for impedance matching. After the Δ-type load 561, a third branch may include a third transmission line 525 and a third filter 535 for impedance matching. On the same principle as in FIG. 5A, the low power filter may be arranged in each branch. That is, some components constituting a circuit may be changed within a range obvious to those skilled in the art.

On the other hand, in FIG. 5A and FIG. 5B, the phase shift of the transmission line in each branch is 30°, 90°, or 150°, respectively. Various modifications may be made within the same principle such as 45°, 105°, or 165° respectively, or 15°, 75°, or 135° respectively, etc. In addition to the filter arranged between the splitter and the antenna element, as a sum of reflected wave components by the filter among reflected wave components of a sub-array is close to zero (0), whether the present disclosure is implemented may be checked. Also, according to an embodiment, the filter is arranged at a different distance in each branch, whereby whether the present disclosure is implemented may be checked.

Figure 6:
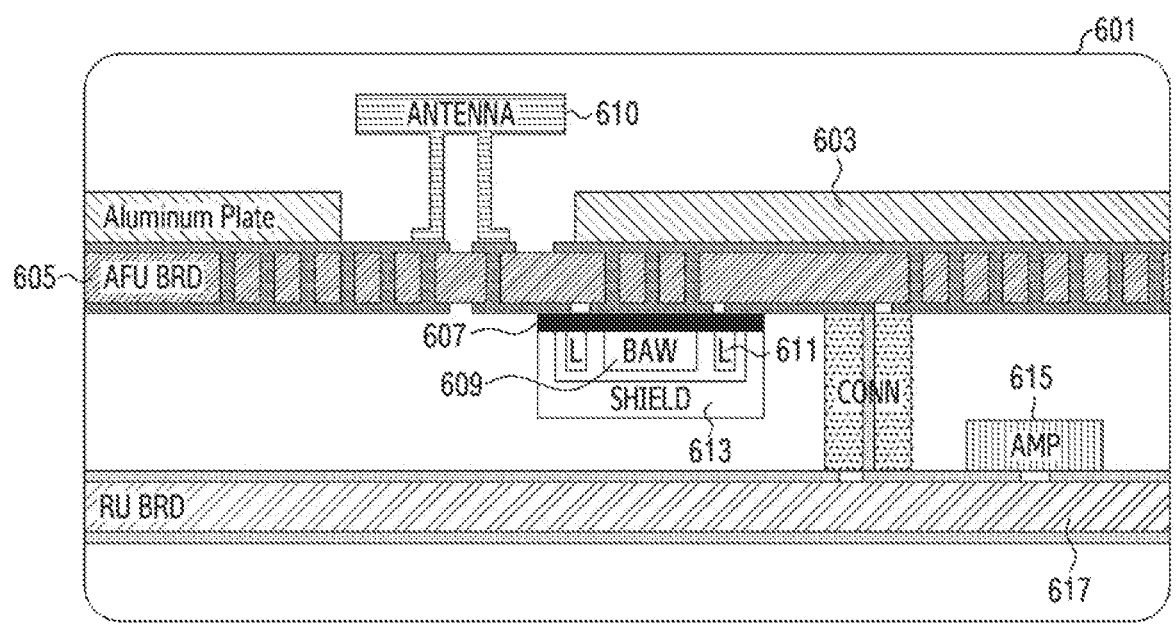
FIG. 6 illustrates an example of a cross-section of an antenna device including a low power filter according to one or more embodiments of the present disclosure.

FIG. 6 illustrates an example of a cross-section of an electronic device 601 including a low power filter according to one or more embodiments of the present disclosure. In FIG. 6, the low power filter may include a BAW filter 609.

Referring to FIG. 6, the electronic device 601 may include an antenna board 605 (e.g., an Antenna Feeder Unit (AFU) board). A plate 603 may be positioned on an upper surface of the antenna board 605. In an example, the plate 603 may be made of aluminum. The plate 603 may have an opening portion. The antenna element 610 may be mounted on the upper surface of the antenna board 605 via the opening portion of the plate 603. Although one antenna element is illustrated in FIG. 6, an array antenna including a plurality of antenna elements (or a plurality of sub-arrays) may be attached to the upper surface of the antenna board 605.

A substrate 607 is arranged on a lower surface of the antenna board 605. A BAW filter 609 may be attached to the substrate 607. As a frequency of an applied electrical signal approaches a specific frequency, a specific acoustic wave may be provided according to a resonance phenomenon. The specific acoustic wave may perform medium dynamics for passing a signal between electrodes. Accordingly, the BAW filter 609 may perform a function of selectively passing a signal of a specific frequency. The substrate 607 may include an inductor 611, together with the BAW filter 609. The inductor 611 may be arranged as a passive element for processing such as providing, amplifying, transmitting, etc. of a high-frequency electrical signal. A shield 613 may be arranged in the form of a housing surrounding the BAW filter 609, in order to secure the electromagnetic shielding characteristics for the BAW filter 609 on the substrate 607. The shield 613 may be physically coupled to the substrate 607 to 'accommodate' a piezoelectric layer and upper and lower electrodes of the BAW filter 609. In other words, the shield 613 'protects' the piezoelectric layer and upper and lower electrodes of the BAW filter 609 from a physical or electric shock or reducing the influence of an object from the outside.

The electronic device 601 may include a Radio Unit (RU) board 617. The RU board 617 may be connected to the antenna board 605. A power amplifier 615 may be arranged on an upper surface of the RU board 617.

The cross-section and structures shown in FIG. 6 are only examples for describing the low power filter mounted on the antenna board, and are not construed as limiting the arrangement structure of the present disclosure. For example, the filter may be arranged on a separate PCB rather than on the lower surface of the antenna board. For another example, instead of the inductor, an active element may be included on both sides of the BAW filter as well. Also, for further example, other housing structures may be included instead of the shield 613 including the BAW filter as well.

Figure 7A:
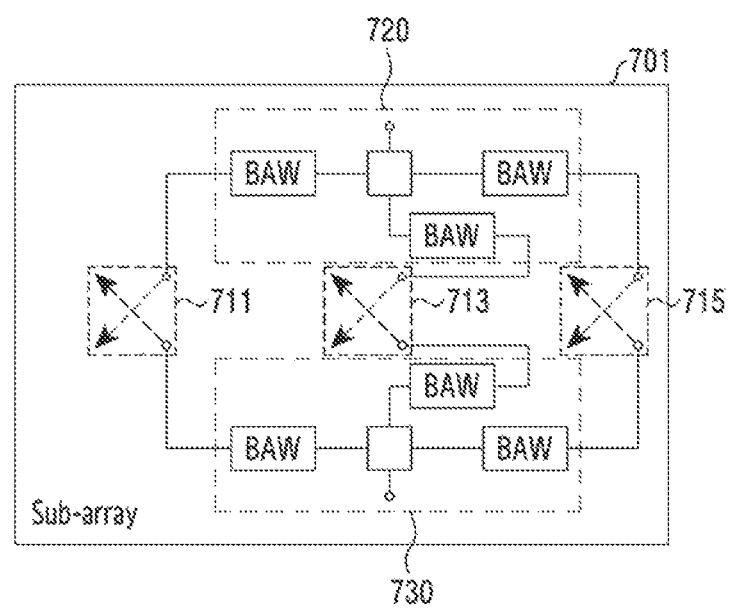
FIG. 7A illustrates an example of a sub-array of an antenna device according to one or more embodiments of the present disclosure.

FIG. 7A illustrates an example of a sub-array of an antenna device according to one or more embodiments of the present disclosure. An example of a structure including the sub-array and low power filters of the present disclosure is described.

Referring to FIG. 7A, a sub-array structure 701 may include a first antenna element 711, a second antenna element 713, and a third antenna element 715. That is, the sub-array may have a 3×1 structure. Each antenna element may be a cross-pole antenna having two mutually orthogonal polarities. The antenna elements corresponding to each polarity may be connected to an arrangement structure of the low power filter. Here, the arrangement structure of the low power filter may include a splitter (e.g., a 3-way splitter) and a low power filter (e.g., a BAW filter) arranged in each branch of the splitter. For example, poles corresponding to +45° may be connected to a first low power filter arrangement structure 720. Poles corresponding to −45° may be connected to a second low power filter arrangement structure 730. According to an embodiment, as mentioned in FIG. 6, the antenna elements may be connected through a filter and an antenna board corresponding to a polarity of each sub-array. The implementation of the present disclosure may be checked by confirming the low power filter arranged between the antenna element and the splitter, before an RF path for the sub-array.

Figure 7B:
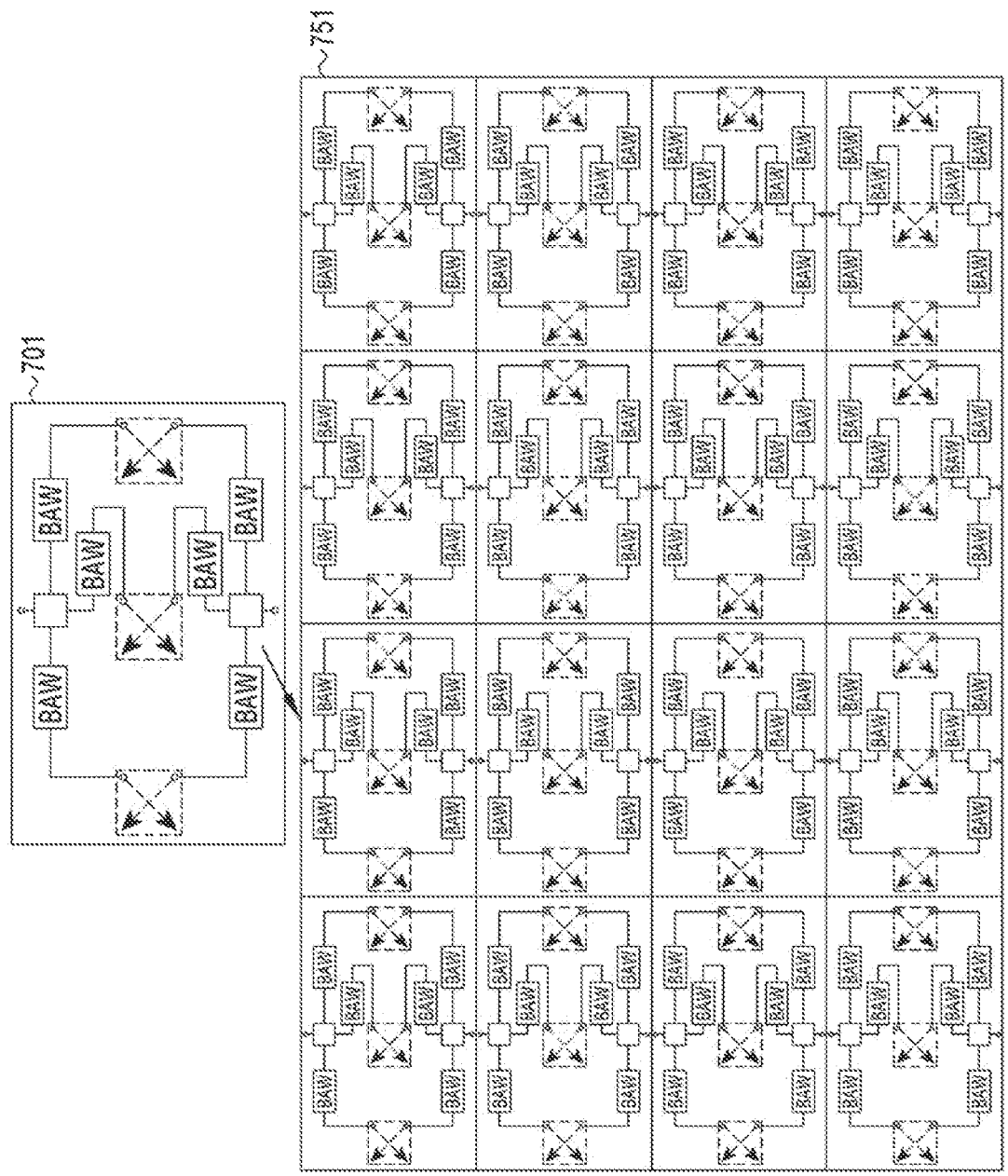
FIG. 7B illustrates an example of an antenna array of an antenna device according to one or more embodiments of the present disclosure.

FIG. 7B illustrates an example of an antenna array of an antenna device according to one or more embodiments of the present disclosure. The antenna array may include a plurality of sub-arrays. Here, each sub-array exemplifies the sub-array structure 701 of FIG. 7A. According to an embodiment, an MMU may include the antenna array shown in FIG. 7B.

Referring to FIG. 7B, an antenna array structure 751 may include a plurality of sub-arrays. The plurality of sub-arrays may present a service not only on the ground but also in a tall building through horizontal beamforming as well as vertical beamforming. As in FIG. 7B, each sub-array may be two-dimensionally arranged to form a two-dimensional array antenna.

As such, in order to improve a data capacity of 5G communication, the number of sub-arrays (i.e., the number of RF paths) increases, and for this purpose, as the size of a filter configured for each RF path becomes smaller, it is advantageous in terms of cost reduction. In addition, due to the mass production of BAW filters, a small error may be achieved at each sub-array connection. The small error may also present an effect of improving performance by minimizing a cumulative loss of the entire array antenna. In other words, the low power filter arrangement structure of the present disclosure may not only replace a high power filter of a single sub-array, but also be arranged in each of a plurality of sub-arrays, thereby presenting an additional effect of improving the entire transmission performance.

An MMU device may configure an antenna unit in a form including a plurality of sub-arrays. At this time, when the number of filters installed in the MMU device corresponds to the product of the number of the plurality of sub-arrays, the number of antenna elements included in each sub-array, and the number of polarizations, the implementation of the arrangement structure (implemented with a plurality of low power filters instead of a small number of high power filters) may be checked. In an example, in the case of a dual polarization antenna element, the number of polarizations may be two.

Figure 8A:
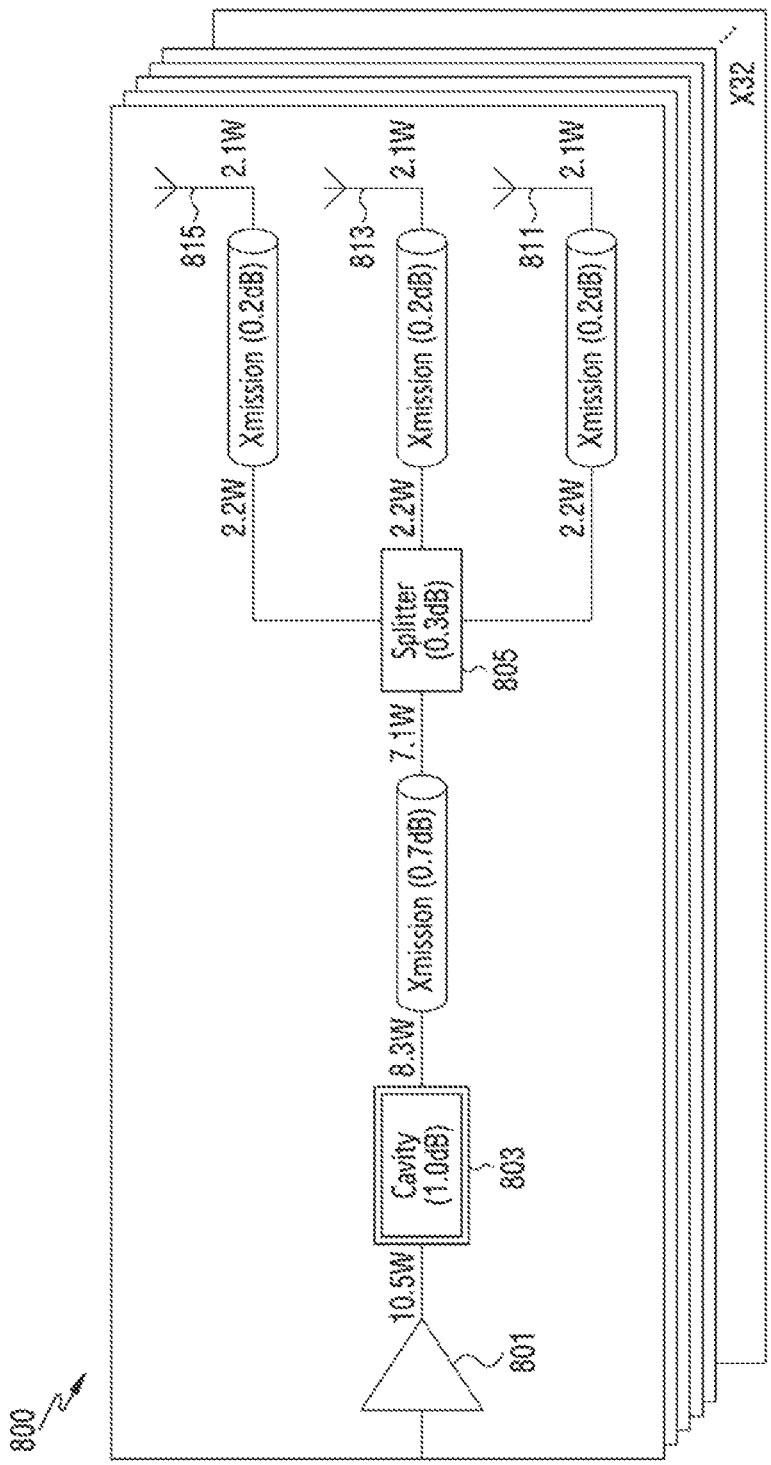
FIG. 8A illustrates an example of a rated capacity of a high power filter in relevant art.

FIG. 8A illustrates an example of a rated capacity of a high power filter in relevant art. The high power filter may be replaced by a low power filter according to one or more embodiments of the present disclosure. The high power filter exemplifies a metal cavity filter.

Referring to FIG. 8A, an antenna structure 800 may include a power amplifier 801, a high power filter 803, a splitter 805, a first antenna element 811, a second antenna element 813, and a third antenna element 815. The high power filter 803 may be arranged before the splitter 805 after the power amplifier 801. Thus, the high power filter 803 may accommodate the input of 10.5 W. Thereafter, the splitter 805 is a 3-way splitter, and may distribute an inputted signal to each antenna element. Due to a high accommodation capacity of the high power filter 803, high performance is required when a product is manufactured and therefore, there is a problem in that it is not suitable for an array-type antenna in which a large number of sub-arrays are coupled. To solve this problem, FIG. 8B illustrates an arrangement structure for solving a problem of a power capacity while replacing the high power filter with the low power filter.

Figure 8B:
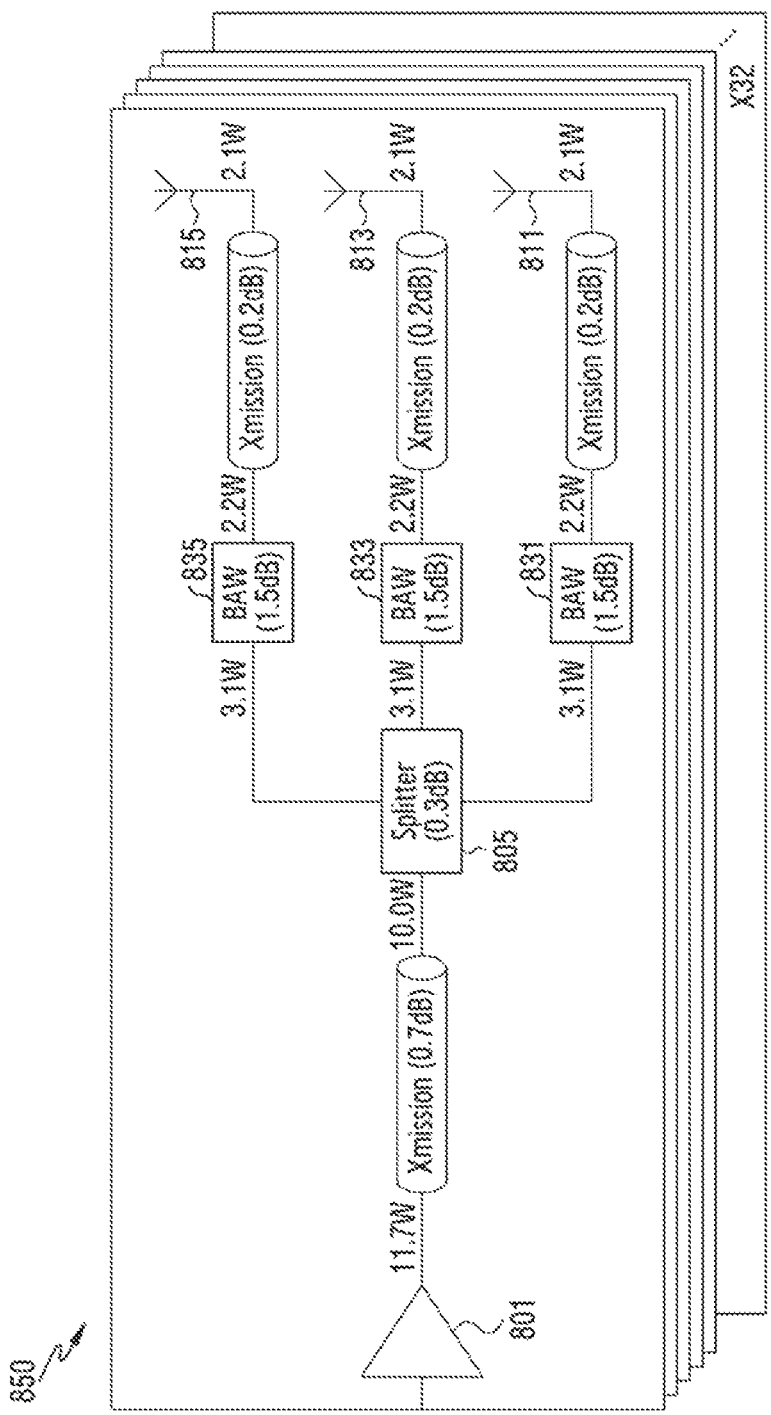
FIG. 8B illustrates an example of a rated capacity of a low power filter according to one or more embodiments of the present disclosure.

FIG. 8B illustrates an example of a rated capacity of a low power filter according to one or more embodiments of the present disclosure. Here, the low power filter is a filter for replacing the high power filter 803 of FIG. 8A, and exemplifies a BAW filter.

Referring to FIG. 8B, an antenna structure 850 may include a power amplifier 801, a splitter 805, a first antenna element 811, a second antenna element 813, a third antenna element 815, a first low power filter 831, a second low power filter 833, and a third low power filter 835. Although power inputted to the splitter 805 is 10 W, the power is distributed by the splitter 805. The power distributed to each branch of the splitter 805 is 3.1 W, and when the BAW filter may accommodate 3.1 W (instead of 10 W), the arrangement of the BAW filter does not cause a problem in circuit operation. That is, in order to accommodate the power, the low power filter is not arranged before the splitter, but may be arranged at a rear end of each branch of the splitter.

Through the arrangement of the low power filter dependent on the branch of the splitter, a filter having a smaller rated capacity than a metal resonator filter may be used, and due to this, the size and weight of equipment may be greatly reduced by an advantage of a filter of a rated capacity or less. Although an antenna structure corresponding to one sub-array is exemplarily illustrated in FIG. 8B, antenna equipment such as an MMU may include a plurality of sub-arrays. For example, in the case of 32T32R (32 transmission antenna ports and 32 reception antenna ports), the antenna structure 850 of FIG. 8B may include 32 antenna structures as shown in FIG. 7B. When the small filter such as SAW/BAW is used, a mass production may be increased and a great cost saving effect may be achieved, because separate tuning is not required and return loss performance may be secured according to filter arrangement considering a phase shift of a reflected wave.

Figure 9:
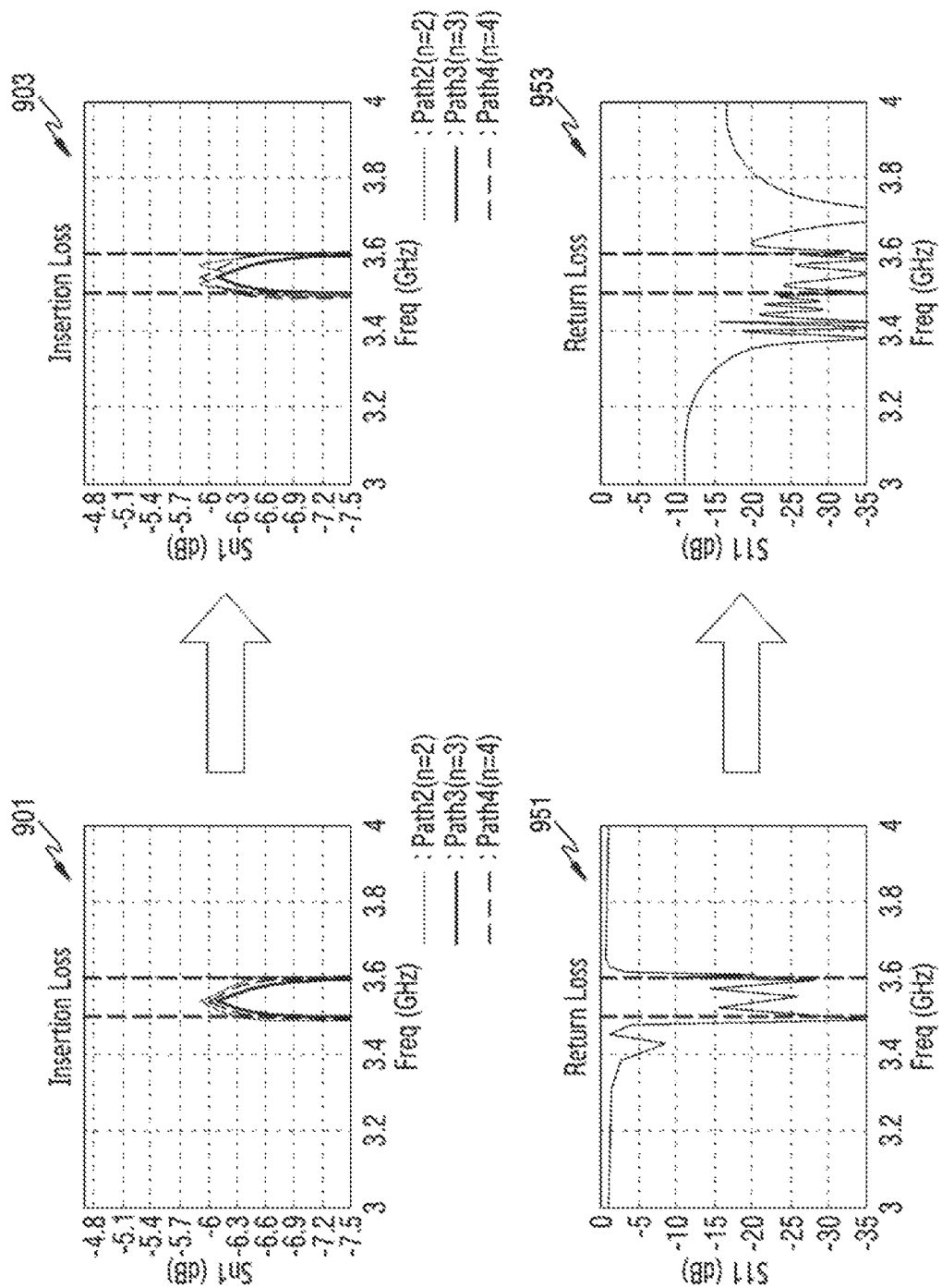
FIG. 9 illustrates an example of a graph for an effect dependent on the design of a low power filter according to one or more embodiments of the present disclosure.

FIG. 9 illustrates a graph for an example of an effect dependent on a design of a low power filter according to one or more embodiments of the present disclosure. The effect is expressed as an insertion loss and a return loss. The insertion loss means a loss that occurs as an input signal passes through a corresponding device, and the return loss means a loss that occurs as the input signal of the corresponding device is reflected and returned.

Referring to FIG. 9, a first graph 901 and a second graph 903 show relationships between a frequency and the insertion loss. The first graph 901 simply shows the relationship between the frequency and the insertion loss, when positions of the low power filters are simply the same as in FIG. 4A. The second graph 903 shows the relationship between the frequency and the insertion loss, when the low power filter is arranged at the rear end of the splitter by using the phase shift as shown in FIG. 4B. Through the phase shift, a sum of each reflected wave caused by the input of a filter stage may be zero (0).

A horizontal axis of the first graph 901 indicates the frequency, and a vertical axis indicates the insertion loss. The 'n' represents the number of branch paths. A horizontal axis of the second graph 903 indicates the frequency, and a vertical axis indicates the insertion loss. The 'n' represents the number of branch paths. Comparing the first graph 901 and the second graph 903, it may be confirmed that the effect caused by the insertion loss is the same regardless of the arrangement considering the phase shift.

In FIG. 9, a third graph 951 and a fourth graph 953 show relationships between the frequency and the return loss. The third graph 951 shows the relationship between the frequency and the return loss, when positions of the low power filters are simply the same as in FIG. 4A. The fourth graph 953 shows the relationship between the frequency and the return loss, when the low power filter is arranged at the rear end of the splitter by using a phase shift as shown in FIG. 4B. Through a phase shift, a sum of each reflected wave caused by the input of a filter stage may be zero (0).

A horizontal axis of the third graph 951 indicates the frequency, and a vertical axis indicates the return loss ($S_{11}$) caused by an input. A horizontal axis of the fourth graph 953 indicates the frequency, and a vertical axis indicates the return loss ($S_{11}$) caused by an input. When the third graph 951 and the fourth graph 953 are compared, it may be confirmed that the return loss is reduced by about 10 dB. As in FIGS. 5A and 5B, each filter is arranged in consideration of a phase delay through a transmission line, whereby a sum of reflected waves caused by the arrangement of the low power filter may be all canceled.

In relevant art, one high power filter was used in one RF path inputted to a sub-array. A rated capacity of the requirements was met with only one filter. However, as beamforming is introduced to increase a data rate and control high frequency performance, a larger number of filters are required for an antenna device. Since the high power filter is not suitable for a mass production such as a tuning work through human's screw, a high cost for high performance, etc., one or more embodiments of the present disclosure have suggested a technique for replacing the high power filter with a low power filter such as a BAW filter.

Since even a filter of a rated capacity or less is arranged after the branch of the splitter, the filter arrangement structure of one or more embodiments may meet the power requirements. Specifically, since the filters of the present disclosure are attached after the splitter (or divider), a rated capacity required for each filter is lowered, and due to this, the small low power filter may replace the high power filter such as a metal cavity filter. Also, unlike the high power filter for high performance, the low power filter may be produced in a relatively small size, so the size of antenna equipment may also be reduced. According to an embodiment, by designing to form a phase difference of a transmission line through which a reflected wave is transmitted at a predetermined interval for each branch, the reflected waves of the filter may be canceled out with each other. Due to this, the effect caused by the return loss may be reduced.

The present disclosure has described, as an example, a connection structure between a filter, an RF circuit (e.g., a power amplifier, a splitter), and an antenna element, but the electronic device in which a plurality of filters are connected may also be understood as an embodiment of the present disclosure, since the electronic device of the present disclosure targets communication equipment in which a large amount of antenna elements are integrated. According to an embodiment, some filters of the electronic device may have a conventional high power filter connection structure (e.g., FIGS. 2 and 8A), and some other filters may have a proposed low power filter arrangement structure (e.g., FIGS. 3, 4A, 4B, and 8B). Also, according to an embodiment, among even the same low power filter, filters for some sub-arrays may be arranged according to a reflected wave phase design for a return loss, while filters for some other sub-arrays may be arranged at the same location as well.

Through the embodiments of the present disclosure, the arrangement structure including the power amplifier, the filter, and the antenna elements has been proposed. The electronic device including this arrangement structure may also be understood as an embodiment of the present disclosure. The electronic device may include at least one processor such as a modem. The at least one processor may include an up converter for up-converting a digital transmission signal of a base band into a transmission frequency, and a Digital-to-Analog Converter (DAC) for converting the up-converted digital transmission signal into an analog RF transmission signal. Also, the at least one processor may include an Analog-to-Digital Converter (ADC) for converting an analog RF reception signal into a digital reception signal, and a down converter for converting the digital reception signal into a digital reception signal of a base band. A path through which a signal is received may include a Low-Noise Amplifier (LNA) instead of a power amplifier as well.

In the present disclosure, terms of a front end and a rear end have been used to explain a positional relationship between a splitter and a filter. This is written in terms of transmission standards, and the terms of the front end and the rear end are only terms used to explain the arrangement structure shown in the drawings, and are not construed as limiting the embodiment of the present disclosure. Undoubtedly, the embodiment of the present disclosure may be applied to an array antenna for a receiving end as well as a transmitting operation. The arrangement of a low power filter (e.g., a BAW filter) proposed in the present disclosure between a splitter of a sub-array and respective antenna elements may also be understood as an embodiment of the present disclosure.

According to embodiments of the present disclosure, a device for radiating a signal in a wireless communication system may include a power amplifier, a plurality of antenna elements, a splitter for branching into each of the plurality of antenna elements, and a plurality of filters. The plurality of filters may be arranged on branches of the splitter, respectively.

According to an embodiment of the present disclosure, the plurality of antenna elements may include a first antenna element, a second antenna element, and a third antenna element, and the plurality of filters may include a first filter arranged between the first antenna element and the splitter, a second filter arranged between the second antenna element and the splitter, and a third filter arranged between the third antenna element and the splitter.

According to an embodiment of the present disclosure, the plurality of antenna elements may be included in a sub-array, and the splitter may include an N-way divider according to the number of the plurality of antenna elements.

According to an embodiment of the present disclosure, a specified rated capacity of each of the plurality of filters may be lower than input power from the power amplifier to the splitter.

According to an embodiment of the present disclosure, the specified rated capacity of each of the plurality of filters may be greater than or be equal to a value obtained by dividing the input power by the number of the plurality of filters.

According to an embodiment of the present disclosure, the plurality of filters may be arranged wherein a sum of reflected waves by incident waves on the plurality of filters respectively is minimized.

According to an embodiment of the present disclosure, the plurality of filters may be arranged wherein a sum of reflected waves by incident waves on the plurality of filters respectively becomes zero (0).

According to an embodiment of the present disclosure, the plurality of filters may be arranged wherein some of reflected waves with respect to incident waves of the plurality of filters are canceled due to a phase difference.

According to an embodiment of the present disclosure, the plurality of filters may be arranged on a transmission line in which a phase difference between adjacent branches meets Equation below, when the plurality of filters are arranged in the order of phase shift.

$$\theta_d = \frac{360}{2N}$$

Here, the '$\theta_d$' is the phase difference, and the 'N' is the number of the plurality of filters.

According to an embodiment of the present disclosure, the plurality of antenna elements may include a first antenna element, a second antenna element, and a third antenna element, the plurality of filters may include a first filter arranged between the first antenna element and the splitter, a second filter arranged between the second antenna element and the splitter, and a third filter arranged between the third antenna element and the splitter, the first filter may be arranged in a position inducing a first phase shift from the splitter, the second filter may be arranged in a position inducing a second phase shift from the splitter, the third filter may be arranged in a position inducing a third phase shift from the splitter, a difference between a value of the first phase shift and a value of the second phase shift may be 60 degrees, a difference between the value of the second phase shift and a value of the third phase shift may be 120 degrees, and a difference between the value of the first phase shift and the value of the third phase shift may be 180 degrees.

According to an embodiment of the present disclosure, the device may further include a Printed Circuit Board (PCB), and the plurality of antenna elements may be arranged on an upper surface of the PCB, and the plurality of filters is arranged on a lower surface of the PCB.

According to an embodiment of the present disclosure, the device may further include at least one processor configured to provide a Radio Frequency (RF) signal, and the RF signal may be radiated through each of the plurality of antenna elements, via the power amplifier and the splitter.

According to an embodiment of the present disclosure, the splitter may be connected to the power amplifier without a separate filter, and each of the plurality of filters may be connected to the splitter.

According to an embodiment of the present disclosure, the plurality of filters may include an elastic filter or a ceramic filter, and the elastic filter may include a Surface Acoustic Wave (SAW) filter or a Bulk Acoustic Wave (BAW) filter.

According to embodiments of the present disclosure, a massive Multiple Input Multiple Output (MIMO) Unit (MMU) device may include at least one processor, a plurality of power amplifiers, an antenna array including a plurality of sub-arrays, and a plurality of filters. The plurality of sub-arrays may include a first sub-array, the first sub-array may include a plurality of antenna elements, and a filter for filtering a specific frequency band may be arranged in each of the plurality of antenna elements.

According to an embodiment of the present disclosure, the number of the plurality of filters may correspond to a product of the number of the plurality of sub-arrays and the number of antenna elements included in each of the plurality of sub-arrays.

According to an embodiment of the present disclosure, in the MMU device, each of the plurality of filters may include a BAW filter.

According to an embodiment of the present disclosure, a rated capacity of the filter is lower than input power of a signal inputted to a RF path of the first sub-array, and may be larger than a value dividing the input power by the number of antenna elements of the first sub-array.

According to an embodiment of the present disclosure, the plurality of sub-arrays may include a second sub-array, and the second sub-array may include a first antenna element and a second antenna element branched through a splitter, and a first distance from the first filter and the splitter for the first antenna element may be different from a second distance from the second filter and the splitter for the second antenna element.

Methods of the embodiments described in the claims or specifications of the present disclosure may be implemented in the form of hardware, software, or a combination of hardware and software.

When implemented in software, a computer-readable storage medium storing one or more programs (software modules) may be presented. One or more programs stored in the computer-readable storage medium are configured to be executable by one or more processors in an electronic device. The one or more programs include instructions for causing the electronic device to execute methods of embodiments described in the claim or specification of the present disclosure.

Such programs (software modules, software) may be stored in a random access memory, a non-volatile memory including a flash memory, a read only memory (ROM), an electrically erasable programmable ROM (EEPROM), a magnetic disc storage device, a compact disc-ROM (CD-ROM), digital versatile discs (DVDs), or other optical storage devices or magnetic cassettes. Or, it may be stored in a memory composed of a combination of some or all thereof. Also, each configuration memory may be included in plurality as well.

Also, the program may be stored in an attachable storage device that may be accessed through a communication network such as the Internet, an intranet, a Local Area Network (LAN), a Wide Area Network (WAN), or a Storage Area Network (SAN), or a communication network including a combination thereof. This storage device may be connected to a device performing an embodiment of the present disclosure through an external port. Also, a separate storage device on the communication network may be connected to the device performing the embodiment of the present disclosure.

In specific embodiments of the present disclosure described above, components included in the disclosure are expressed as singular or plural according to the specific embodiments presented. However, the singular or plural expression is appropriately selected for the context presented for convenience of description, and the present disclosure is not limited to the singular or plural component, and even if a component is expressed as plural, it may be composed of singular, or even if the component is expressed in the singular number, it may be composed of plural.

Although specific embodiments have been described in a detailed description of the present disclosure, various modifications are possible without departing from the scope of the present disclosure. Therefore, the scope of the present disclosure should not be limited to the described embodiments and should be defined by the claims described below as well as equivalents to these claims.

What is claimed is:

1. A device for radiating a signal in a wireless communication system, the device comprising:
   a power amplifier;
   a plurality of antenna elements;
   a splitter connected to the power amplifier, wherein the splitter branches a signal from the power amplifier into a plurality of paths, wherein each of the plurality of paths is connected to each of the plurality of antenna elements; and
   a plurality of filters, wherein each of the plurality of filters is arranged on each of the plurality of paths, respectively, based on a phase difference between adjacent paths;
   wherein the phase difference is determined based on a number of the plurality of filters.

2. The device of claim 1, wherein:
   the plurality of antenna elements comprises a first antenna element, a second antenna element, and a third antenna element, and
   the plurality of filters comprises:
      a first filter arranged between the first antenna element and the splitter,
      a second filter arranged between the second antenna element and the splitter, and
      a third filter arranged between the third antenna element and the splitter.

3. The electronic device of claim 1, wherein;
   the plurality of antenna elements is included in a sub-array, and
   the splitter comprises an N-way divider according to a number of the plurality of antenna elements.

4. The device of claim 1, wherein a specified rated capacity of each of the plurality of filters is lower than input power transmitted from the power amplifier to the splitter.

5. The device of claim 4, wherein the specified rated capacity of each of the plurality of filters is greater than or is equal to a value obtained by dividing the input power by the number of the plurality of filters.

6. The device of claim 1, wherein the plurality of filters are arranged such that a sum of reflected waves by incident waves on the plurality of filters is minimized.

7. The device of claim 1, wherein the plurality of filters are arranged such that a sum of reflected waves by incident waves on the plurality of filters becomes zero (0).

8. The device of claim 1, wherein the plurality of filters are arranged such that a portion of reflected waves with respect to incident waves on the plurality of filters is canceled due to phase differences of the portion of reflected waves.

9. The device of claim 1,
   wherein the plurality of filters are arranged on transmission lines with different lengths, respectively, such that the plurality of filters are arranged in an order of phase shift,
   wherein the phase difference between adjacent paths meets $\theta_d=360/2N$, and
   wherein the '$\theta_d$' is the phase difference and the 'N' is the number of the plurality of filters.

10. The device of claim 1,
   wherein the plurality of antenna elements comprises a first antenna element, a second antenna element, and a third antenna element,
   wherein
   the plurality of filters comprises:
      a first filter arranged between the first antenna element and the splitter,
      a second filter arranged between the second antenna element and the splitter, and
      a third filter arranged between the third antenna element and the splitter, and
   wherein the first filter is arranged in a position inducing a first phase shift from the splitter, the second filter is arranged in a position inducing a second phase shift from the splitter, the third filter is arranged in a position inducing a third phase shift from the splitter, a difference between the first phase shift and the second phase shift is 60 degrees, a difference between the second phase shift and the third phase shift is 120 degrees, and a difference between the first phase shift and the third phase shift is 180 degrees.

11. The device of claim 1, further comprising a printed circuit board (PCB), wherein:

the plurality of antenna elements are arranged on an upper surface of the PCB, and the plurality of filters are arranged on a lower surface of the PCB.

12. The device of claim 1, further comprising at least one processor configured to provide an input signal to the power amplifier, wherein an output signal radiated by the plurality of antenna elements is a Radio Frequency (RF) signal.

13. The device of claim 1, wherein the splitter is directly connected to the power amplifier.

14. The device of claim 1, wherein the plurality of filters comprises at least one of an elastic filter or a ceramic filter, and the elastic filter comprises at least one of a Surface Acoustic Wave (SAW) filter or a Bulk Acoustic Wave (BAW) filter.

15. A Multiple input Multiple output Unit (MMU) device comprising:

a plurality of power amplifiers;

an antenna array comprising a plurality of sub-arrays, wherein the plurality of sub-arrays comprising a first sub-array, the first sub-array comprising:

a plurality of antenna elements, a splitter for branching a signal into a plurality of paths, wherein each of the plurality of paths is connected to each of the plurality of antenna elements, and a plurality of filters for filtering a specific frequency band, wherein each of the plurality of filters is arranged on each of the plurality of paths, respectively, based on a phase difference between adjacent paths, wherein the phase difference is determined based on a number of the plurality of filters.

16. The MMU device of claim 15, wherein the splitter comprises an N-way divider according to a number of the plurality of antenna elements.

17. The MMU device of claim 15, wherein a specified rated capacity of each of the plurality of filters is lower than input power transmitted from the plurality of power amplifiers to the splitter.

18. The MMU device of claim 17, wherein the specified rated capacity of each of the plurality of filters is greater than or is equal to a value obtained by dividing the input power by the number of the plurality of filters.

19. The MMU device of claim 15, wherein the plurality of filters are arranged such that a sum of reflected waves by incident waves on the plurality of filters is minimized.

20. The MMU device of claim 15, wherein the plurality of filters are arranged such that a sum of reflected waves by incident waves on the plurality of filters becomes zero (0).

* * * * *